United States Patent
Kitazaki et al.

(10) Patent No.: US 10,811,591 B2
(45) Date of Patent: *Oct. 20, 2020

(54) PIEZOELECTRIC COMPOSITION AND PIEZOELECTRIC DEVICE

(71) Applicant: TDK CORPORATION, Tokyo (JP)

(72) Inventors: Masashi Kitazaki, Tokyo (JP); Keisuke Teranishi, Tokyo (JP); Makoto Ishizaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 351 days.

This patent is subject to a terminal disclaimer.

(21) Appl. No.: 15/914,093

(22) Filed: Mar. 7, 2018

(65) Prior Publication Data

US 2018/0261758 A1    Sep. 13, 2018

(30) Foreign Application Priority Data

Mar. 9, 2017   (JP) ................................ 2017-045302

(51) Int. Cl.
  H01L 41/187    (2006.01)
  C04B 35/628    (2006.01)
  (Continued)

(52) U.S. Cl.
  CPC .......... H01L 41/1871 (2013.01); C04B 35/26 (2013.01); C04B 35/4682 (2013.01);
  (Continued)

(58) Field of Classification Search
  CPC ............ H01L 41/1871; H01L 41/1874; H01L 41/43; C04B 35/26; C04B 35/4682
  See application file for complete search history.

(56) References Cited

U.S. PATENT DOCUMENTS 7,754,095 B2   7/2010   Kawada et al.
7,910,016 B2   3/2011   Kawada et al.
(Continued)

FOREIGN PATENT DOCUMENTS

JP   2013-095627 A   5/2013
JP   2013-191751 A   9/2013

OTHER PUBLICATIONS

Sep. 6, 2018 Search Report issued in European Patent Application No. 18160735.9.

(Continued)

Primary Examiner — C Melissa Koslow
(74) Attorney, Agent, or Firm — Oliff PLC

(57) ABSTRACT

A piezoelectric composition comprises a plurality of crystal particles, wherein the piezoelectric composition includes bismuth, iron, barium, titanium, and oxygen; the crystal particles include a core and a shell covering the core; the average value of the contents of bismuth in the cores is expressed as $C_{CORE}$ % by mass, the average value of the contents of bismuth in the shells is expressed as $C_{SHELL}$ % by mass, and the $C_{CORE}$ is lower than the $C_{SHELL}$; and the number of all the particles comprised in the piezoelectric composition is expressed as N, the number of the crystal particles including the core and the shell is expressed as n, and n/N is 0.10 to 1.00.

5 Claims, 5 Drawing Sheets

(51) Int. Cl.
  *C04B 35/26* (2006.01)
  *C04B 35/468* (2006.01)
  *C04B 35/475* (2006.01)
  *C04B 35/626* (2006.01)
  *C04B 35/64* (2006.01)
  *H01L 41/43* (2013.01)

(52) U.S. Cl.
  CPC ........ *C04B 35/475* (2013.01); *C04B 35/6262* (2013.01); *C04B 35/6264* (2013.01); *C04B 35/62655* (2013.01); *C04B 35/62826* (2013.01); *C04B 35/62886* (2013.01); *C04B 35/62897* (2013.01); *C04B 35/64* (2013.01); *H01L 41/1878* (2013.01); *H01L 41/43* (2013.01); *C04B 2235/3215* (2013.01); *C04B 2235/3236* (2013.01); *C04B 2235/3274* (2013.01); *C04B 2235/3298* (2013.01); *C04B 2235/5436* (2013.01); *C04B 2235/5445* (2013.01); *C04B 2235/6567* (2013.01); *C04B 2235/75* (2013.01); *C04B 2235/768* (2013.01); *C04B 2235/78* (2013.01); *C04B 2235/80* (2013.01); *C04B 2235/96* (2013.01)

(56) References Cited

U.S. PATENT DOCUMENTS

| 9,306,149 | B2 | 4/2016 | Hayashi et al. |
| 2011/0037812 | A1 | 2/2011 | Naono et al. |
| 2014/0354738 | A1 | 12/2014 | Yabuta et al. |
| 2016/0118914 | A1 | 4/2016 | Ifuku et al. |
| 2018/0248106 | A1 | 8/2018 | Ishizaki et al. |
| 2018/0248107 | A1 | 8/2018 | Teranishi et al. |

OTHER PUBLICATIONS

Sep. 6, 2018 Search Report issued in European Patent Application No. 18160508.0.

Tadej Rojac et al. "Strong Ferroelectric Domain-Wall Pinning in BiFeO 3 Ceramics". Journal of Applied Physics, 2010, vol. 108, pp. 074107-1 through 074107-8.

Zhenyong Cen et al. "Effect of Sintering Temperature on Microstructure and Piezoelectric Properties of Pb-Free BiFeO3—BaTiO3 Ceramics in the Composition Range of Large BiFeO3 Concentrations". J Electroceram, 2013, vol. 31, pp. 15-20.

Aug. 21, 2020 Office Action issued in U.S. Appl. No. 15/914,203.

1.0 μm 1.0 μm

PIEZOELECTRIC COMPOSITION AND PIEZOELECTRIC DEVICE

TECHNICAL FIELD

The present invention relates to a piezoelectric composition and a piezoelectric device.

BACKGROUND

A perovskite-type metal oxide is known as a common piezoelectric composition. The composition of a perovskite-type metal oxide is represented by $ABO_3$. A perovskite-type piezoelectric composition is, for example, lead zirconate titanate ($Pb(Zr,Ti)O_3$). The Curie temperature (Tc) of lead zirconate titanate (PZT) is high, and the piezoelectric constant ($d_{33}$) of PZT is high. However, PZT is harmful to the environment or the human body because it includes lead as an element in the A site. The piezoelectric composition not including lead is required in view of influence on the environment or the human body.

A specific example of a piezoelectric composition not using lead is bismuth ferrite ($BiFeO_3$) described in the following Non Patent Literature 1. The Tc of bismuth ferrite (BFO) is high, and BFO exhibits large spontaneous polarization. However, with BFO alone, the anisotropy is high and the leakage current is large, so sufficient piezoelectric performance (for example, piezoelectric constant $d_{33}$) is not obtained.

Therefore, a piezoelectric composition where the Tc is high and the $d_{33}$ is high is required. A binary compound composed of barium titanate and bismuth ferrite is disclosed in the following Non Patent Literature 2. A ternary compound composed of barium titanate, bismuth ferrite and bismuth magnesate titanate is disclosed in Japanese Unexamined Patent Publication No. 2013-191751. A method for producing a piezoelectric body having the piezoelectricity improved from aggregates of ceramic particles in which the crystal orientation is aligned by a magnetic field is disclosed in Japanese Unexamined Patent Publication No. 2013-95627.

[Non Patent Literature 1] Tadej Rojac et al., "Strong ferroelectric domain-wall pinning in $BiFeO_3$ ceramics", JOURNAL OF APPLIED PHYSICS, 108, 074107, 2010.

[Non Patent Literature 2] Zhenyong Cen et al., "Effect of sintering temperature on microstructure and piezoelectric properties of Pb-free $BiFeO_3$—$BaTiO_3$ ceramics in the composition range of large $BiFeO_3$ concentrations", J Electroceram, 31, p. 15-20, 2013.

SUMMARY

Problem to be Solved by the Invention

A piezoelectric composition described in Japanese Unexamined
Patent Publication 2013-191751 is greatly distorted when a sufficiently high electric field is applied. However, it is difficult for a piezoelectric composition described in Japanese Unexamined Patent Publication No. 2013-191751 to have a sufficiently high piezoelectric constant after a polarization process. When a polarization process is performed on a piezoelectric composition described in Non Patent Literature 2, the $d_{33}$ of the piezoelectric composition after a polarization process is around 130 pC/N, which is small. A bismuth ferrite-based piezoelectric composition produced by a method described in Japanese Unexamined Patent Publication No. 2013-95627 has not been realized.

The present invention has been completed in view of the above circumstances, and an object of the present invention is to provide a piezoelectric composition where the piezoelectric constant $d_{33}$ is high, and a piezoelectric device using the piezoelectric composition.

Means for Solving the Problem

A piezoelectric composition according to one aspect of the present invention is a piezoelectric composition comprising a plurality of crystal particles, wherein the piezoelectric composition includes bismuth, iron, barium, titanium and oxygen; the crystal particle includes a core and a shell covering the cores; the average value of the contents of bismuth in the cores is expressed as $C_{CORE}$ % by mass, the average value of the contents of the bismuth in the shells is expressed as $C_{SHELL}$ % by mass, and the $C_{CORE}$ is lower than the $C_{SHELL}$; and the number of all the particles comprised in the piezoelectric composition is expressed as N, the number of crystal particles including the core and the shell is expressed as n; and n/N is 0.10 to 1.00.

In one aspect of the present invention, the $C_{CORE}/C_{SHELL}$ may be 0.10 to 0.95.

A piezoelectric composition according to one aspect of the present invention may be a sintered body.

A piezoelectric device according to one aspect of the present invention comprises the above piezoelectric composition.

In one aspect of the present invention, the piezoelectric constant $d_{33}$ of a piezoelectric composition to which an electric field of 0.1 to 2.0 kV/mm is applied may be 200 pC/N or more.

Effects of Invention

According to the present invention, a piezoelectric composition where the piezoelectric constant $d_{33}$ is high and a piezoelectric device using the piezoelectric composition are provided.

DETAILED DESCRIPTION

Figure 1:
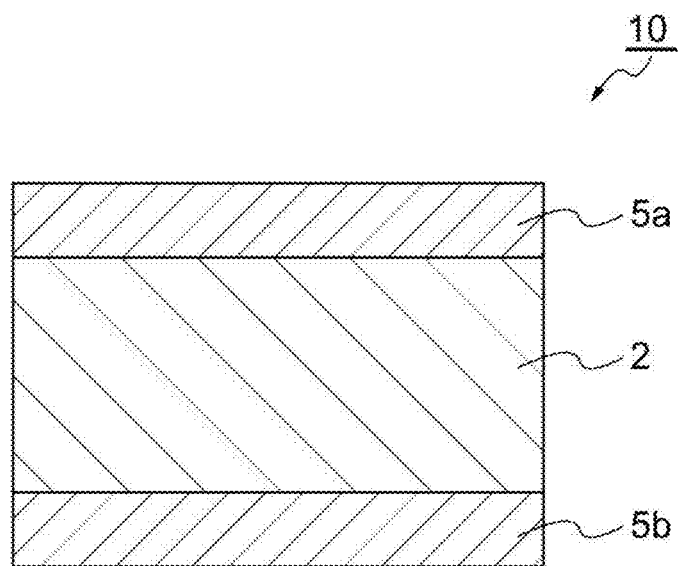
FIG. 1 is a sectional view of a piezoelectric device comprising a piezoelectric composition (piezoelectric body) according to one embodiment of the present invention.

Preferable embodiments of the present invention will be described in detail hereinafter referring to the drawings appropriately. In the drawings, the same or equivalent components are indicated with the same signs. The present invention is not limited to the following embodiments.

Figure 2A:
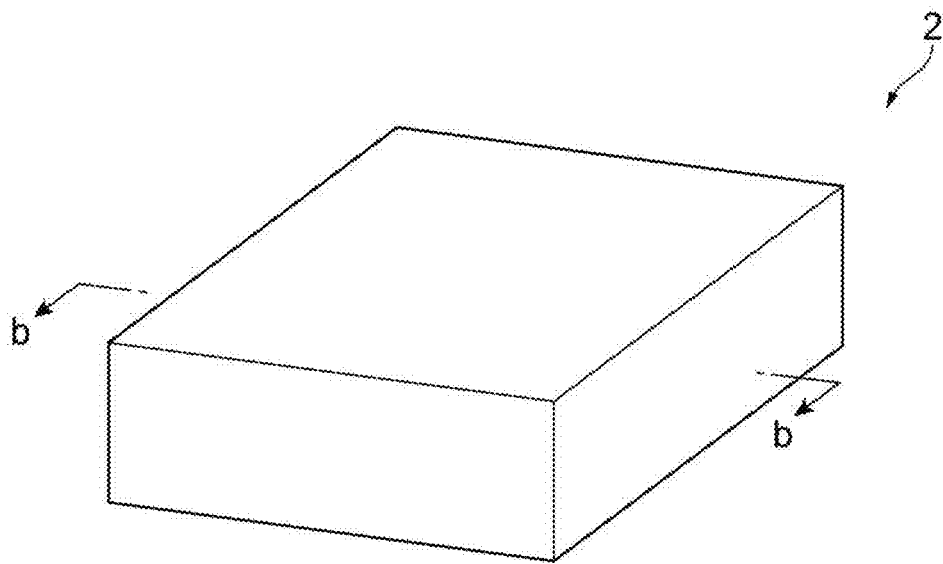
FIG. 2A is a typical perspective view of the piezoelectric composition (piezoelectric body) illustrated in FIG. 1.

As shown in FIG. 1, a piezoelectric device 10 according to this embodiment comprises a pair of electrodes 5a and 5b and a piezoelectric body 2 sandwiched between the pair of electrodes 5a and 5b. That is, an electrode 5a is laid on one surface of the piezoelectric body 2, and a different electrode 5b is laid on the other surface of the piezoelectric body 2. As illustrated in FIG. 2A, the piezoelectric body 2 according to this embodiment is a rectangular parallelepiped. However, the shape of the piezoelectric body 2 is not limited.

The piezoelectric body 2 is a sintered body including a piezoelectric composition. The piezoelectric body 2 may be a sintered body consisting of only the piezoelectric composition. The piezoelectric body 2 may include other ingredients in addition to the piezoelectric composition.

Figure 2B:
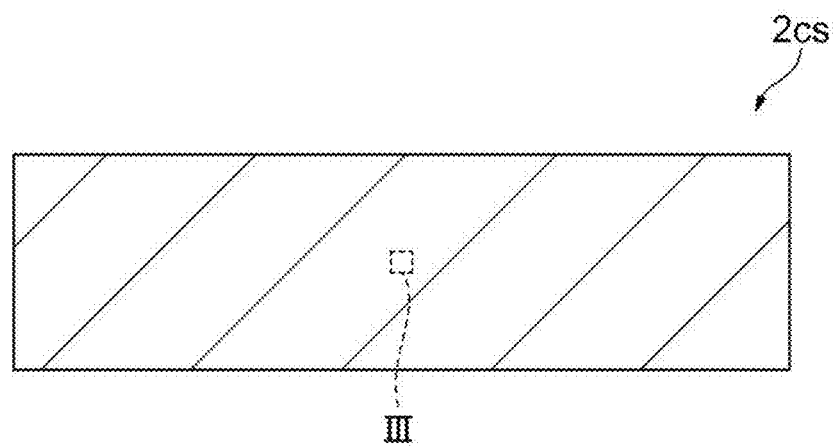
FIG. 2B is a sectional view of the piezoelectric composition (piezoelectric body) illustrated in FIG. 2A (viewed along line b-b)
Figure 3:
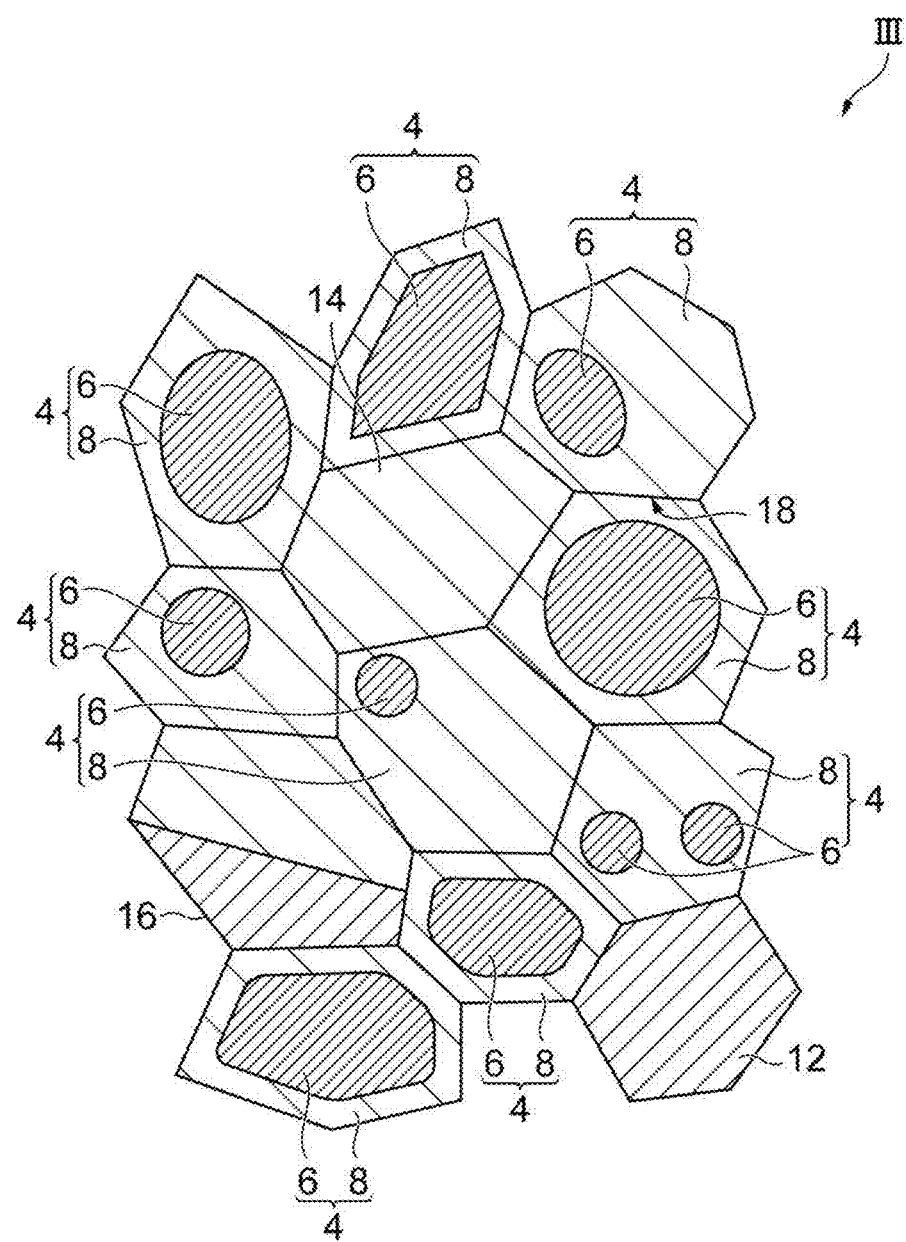
FIG. 3 is an enlarged view of the section of the piezoelectric composition (piezoelectric body) illustrated in FIG. 2B and is a sectional view of a plurality of crystal particles including a core and a shell.

FIG. 3 is an enlarged view of the section 2cs of the piezoelectric body 2 illustrated in FIG. 2B. As illustrated in FIG. 3, the piezoelectric composition constituting the piezoelectric body 2 comprises a plurality (an infinite number) of crystal particles 4. The crystal particles 4 are sintered with each other through grain boundaries 18 (for example, grain boundary phases). The crystal particle 4 has a perovskite-type crystal structure. The crystal particle 4 includes a core 6 and a shell 8 covering the core 6. That is, the crystal particle 4 has a core-shell structure. The core 6 and the shell 8 may be different crystal phases from each other. The core 6 and the shell 8 may have a perovskite-type crystal structure, respectively. The shells 8 is a phase covering a part or all of the core 6. One shell 8 may cover a plurality of cores 6. That is, one crystal particle 4 may include a plurality of cores 6. The crystal particle 4 may consist of only the core 6 and the shell 8. The crystal particle 4 may include other phases in adding to the core 6 and the shell 8. The piezoelectric composition may consist of only the crystal particles 4 including the core 6 and the shell 8. The piezoelectric composition may comprise other types of particles in addition to the crystal particles 4 including the core 6 and the shell 8. For example, the piezoelectric composition may comprise other crystal particles that are different from the crystal particles 4 in the composition or crystal structure. For example, the piezoelectric composition may comprise a particle 12 having substantially the same composition as that of the core 6 of the crystal particle 4. The piezoelectric composition may comprise a particle 14 having substantially the same composition as that of the shell 8 of the crystal particle 4. The composition of a portion of a particle 16 not having a core-shell structure may be substantially the same as that of the core 6, and the composition of other portions of the particle 16 may be substantially the same as that of the shell 8.

The piezoelectric composition constituting the piezoelectric body 2 includes bismuth (Bi), iron (Fe), barium (Ba), titanium (Ti), and oxygen (O) as the main ingredients. The respective crystal particles 4 comprised in the piezoelectric composition may include bismuth, iron, barium, titanium and oxygen. The average value of the contents of bismuth in the cores 6 is expressed as $C_{CORE}$ % by mass, the average value of the contents of the bismuth in the shells 8 is expressed as $C_{SHELL}$ % by mass, and the $C_{CORE}$ is lower than the $C_{SHELL}$. The number of all the particles comprised in the piezoelectric composition is expressed as N, the number of crystal particles including the core 6 and the shell 8 is expressed as n, and n/N is 0.10 to 1.00.

In this embodiment, since the $C_{CORE}$ is lower than the $C_{SHELL}$ and the n/N is 0.10 to 1.00, the piezoelectric constant $d_{33}$ of the piezoelectric composition is higher than those of conventional bismuth ferrite-based piezoelectric compositions. The present inventors consider that a reason why the piezoelectric constant $d_{33}$ of the piezoelectric composition according to this embodiment is high is as follows.

When a crystal particle 4 includes a core 6 and a shell 8 that are different in the composition and crystal structure, a structure gradient region appears in the interface between the core 6 and the shell 8 to ease the mismatch of the crystal structure between the core 6 and the shell 8. For example, the core 6 is a tetragonal or cubic crystal, the shell 8 is a rhombohedral crystal, and the structure gradient region eases distortion between the core 6 and the shell 8. In crystal particle 4 having a structure gradient region, since polarization reversal occurs easily similarly to a morphotropic phase boundary (namely MPB), the piezoelectric characteristics of the crystal particle 4 are improved. Since the n/N, which indicates the proportion of crystal particles 4 having a core-shell structure in a piezoelectric composition, is 0.10 to 1.00, the piezoelectric constant $d_{33}$ of the piezoelectric composition is improved. However, a mechanism with which the piezoelectric constant $d_{33}$ of the piezoelectric composition is improved is not necessarily limited to the above mechanism.

The n/N may be 0.20 to 1.00, 0.30 to 1.00, 0.40 to 1.00, 0.50 to 1.00, 0.60 to 1.00, 0.70 to 1.00, 0.80 to 1.00, or 0.90 to 1.0. As the n/N increases, the piezoelectric constant $d_{33}$ of the piezoelectric composition increases.

The $C_{CORE}/C_{SHELL}$, may be 0.10 to 0.95. When the $C_{CORE}/C_{SHELL}$ is 0.10 to 0.95, the crystal particle 4 readily has a core-shell structure. That is, when the $C_{CORE}/C_{SHELL}$ is 0.10 to 0.95, it is easy for the anisotropy of the crystal structures of the core 6 and the shell 8, respectively, to increase and for a structure gradient region to appear in the interface between the core 6 and the shell 8. The polarization reversal of the piezoelectric composition having a crystal structure with high anisotropy is usually difficult. Meanwhile, since it is easy for polarization reversal to occur in a crystal particle 4 having a structure gradient region, it is easy for the piezoelectric characteristics of the crystal particle 4 to be improved, and for the piezoelectric constant $d_{33}$ of the piezoelectric composition to increase. For the same reason, the $C_{CORE}/C_{SHELL}$ may be 0.20 to 0.90, 0.30 to 0.80, or 0.50 to 0.70.

$C_{SHELL}-C_{CORE}$ (a difference between the contents of bismuth of cores 6 and shells 8) may be, for example, 2% by mass or more and 100% by mass or less. When the $C_{SHELL}-C_{CORE}$ is in the above range, it is easy for the anisotropy of the crystal structures of the core 6 and the shell 8, respectively, to increase and for a structure gradient region to appear in the interface between the core 6 and the shell 8. Consequently, it is easy for polarization reversal to occur in the crystal particle 4, for the piezoelectric characteristics of the crystal particle 4 to be improved, and for the piezoelectric constant $d_{33}$ of the piezoelectric composition to increase.

The average composition of the whole piezoelectric composition may be represented by the chemical formula 1. The average composition of a plurality of crystal particles 4 comprised in the piezoelectric composition may be represented by the chemical formula 1. The average composition of the one crystal particle 4 in whole may be represented by the chemical formula 1.

$$x[Bi_mFeO_3]-y[Ba_nTiO_3] \qquad (1)$$

in the formula 1, 0.6≤x≤0.9, 0.1≤y≤0.4, x+y=1, 0.96≤m≤1.04, 0.96≤n≤1.04.

The average composition of the whole piezoelectric composition may be represented by the chemical formula 2. That is, the piezoelectric composition represented by the chemical formula 1 may be a composite oxide represented by the chemical formula 2. That is, a part or all of the piezoelectric composition may be a solid solution of $Bi_mFeO_3$ and $Ba_nTiO_3$. The average composition of a plurality of crystal particles 4 comprised in a piezoelectric composition may be represented by the chemical formula 2. The average composition of the one crystal particle 4 in whole may be represented by the chemical formula 2. The piezoelectric body 2 may consist of only a piezoelectric composition represented by the chemical formula 2. The piezoelectric body 2 may include other ingredients in addition to the piezoelectric composition represented by the chemical formula 2.

$$(Bi_{xm}Ba_{ym})(Fe_xTi_y)O_3 \quad (2)$$

in the formula 2, $0.6 \leq x \leq 0.9$, $0.1 \leq y \leq 0.4$, $x+y=1$, $0.96 \leq m \leq 1.04$, $0.96 \leq n \leq 1.04$.

A portion of the piezoelectric composition may be a phase consisting of $Bi_mFeO_3$. A portion of the piezoelectric composition may be a phase consisting of $Ba_nTiO_3$.

The particle size of the crystal particle 4 may be, for example, 0.2 to 20 μm. The thickness of the shell 8 may be, for example, 0.05 to 1 μm.

The piezoelectric composition may include elements other than the elements included in the chemical formula 1 or chemical formula 2 as impurities or additives. For example, the piezoelectric composition may include an oxide of Na, Mg, Mn, Nb, V, Al, S, Zr, Si, P, K, Fe, Cu, Zn, Hf, Ta, or W. When the piezoelectric composition includes these oxides and the like, the total content of the respective oxides in the piezoelectric composition may be 0.3% by mass or less of the whole piezoelectric composition.

The average composition of a whole piezoelectric composition may be analyzed, for example, by X-ray fluorescence analysis (an XRF method) or energy dispersive X-ray spectrometry (EDS). A core 6 and a shell 8 of a crystal particle 4 may be identified, for example, by a scanning transmission electron microscope (STEM) and EDS. The core 6 and the shell 8 may be identified by the contrast of images taken, for example, by STEM. The core 6 and the shells 8 may be identified by the difference in the content of Bi measured, for example, by EDS. The contents of each element in the core 6 and the shell 8, respectively, may be measured by EDS.

Since the piezoelectric device 10 comprises the piezoelectric body 2 including the above piezoelectric composition, it is excellent in piezoelectric characteristics. The potential difference between the pair of electrodes 5a and 5b that the piezoelectric device 10 comprises may be, for example, 0.1 to 2.0 kV/mm. In conventional piezoelectric devices using $BiFeO_3$, as long as the potential difference between the electrodes of the piezoelectric device is not a high voltage of 5.0 kV/mm or more, sufficient piezoelectric characteristics are not obtained. Meanwhile, in the piezoelectric device 10 according to this embodiment, even though the potential difference between the electrodes 5a and 5b is a low voltage in the above numerical value range, sufficient piezoelectric characteristic is obtained. For example, the piezoelectric body 2 (piezoelectric composition) to which an electric field of 0.1 to 2.0 kV/mm is applied can have a piezoelectric constant $d_{33}$ of 200 pC/N or more.

Next, an example of a method for manufacturing the piezoelectric composition and a piezoelectric device 10 according to this embodiment will be described. In the manufacturing of a piezoelectric composition, a raw material powder (raw material particle) is first prepared. A formed body is formed by press-forming raw material particle. The formed body is sintered to obtain a sintered body. Then, a piezoelectric body 2 is obtained by performing a polarization process on the sintered body. Electrodes are formed on the piezoelectric body 2 to obtain a piezoelectric device 10. Each step will be described specifically hereinafter.

In a granulating step, starting raw materials of a piezoelectric composition are first weighed. The starting raw materials may be oxides of the respective elements that constitute a piezoelectric composition represented, for example, by chemical formula (1) or compounds that become these oxides after sintering. The compound that is a starting raw material may be, for example, a carbonate, a hydroxide, an oxalate, a nitrate or the like. A specific starting raw material may be, for example, a bismuth compound, an iron compound, a barium compounds, a titanium compound, or the like. The molar ratio of Bi, Fe, Ba and Ti in these starting raw materials may be adjusted to the molar ratio of Bi, Fe, Ba, and Ti in the above chemical formula 1 by weighing the respective starting raw materials.

The bismuth compound (Bi compound) may be bismuth oxide ($Bi_2O_3$), bismuth nitrate ($Bi(NO_3)_3$) or the like. The iron compound (Fe compound) may be iron oxide ($Fe_2O_3$), iron chloride ($FeCl_3$), iron nitrate ($Fe(NO_3)_3$) or the like. The barium compound (Ba compound) may be barium oxide (BaO), barium carbonate ($BaCO_3$), barium oxalate ($C_2BaO_4$), barium acetate (($CH_3COO)_2Ba$), barium nitrate ($Ba(NO_3)_2$), barium sulfate ($BaSO_4$), barium titanate ($BaTiO_3$) or the like. The titanium compound (Ti compound) may be titanium oxide ($TiO_2$) or the like.

In a granulating step, two types of raw material particles (first raw material particles and second raw material particles) that are different in the content of bismuth are prepared by using the starting raw material mentioned above. All of the Bi compound, the Fe compound, the Ba compound and the Ti compound are included in at least either one of the first raw material particle and the second raw material particle. The content of bismuth in the first raw material particles is lower than the content of bismuth in the second raw material particles. That is, the number of moles or the mass of bismuth included in the first raw material particle is smaller than the number of moles or the mass of bismuth included in the second raw material particle. Consequently, this enables manufacturing a piezoelectric composition comprising a crystal particle 4, wherein the $C_{CORE}$ is lower than the $C_{SHELL}$. When the first raw material particles and the second raw material particles are prepared through the sintering and pulverization of the starting raw materials, the content of bismuth in the first raw material particles after sintering is lower than the content of bismuth in the second raw material particles after sintering.

For example, the first raw material particles may be prepared from at least a Ba compound and a Ti compound. A mixture of the above Ba compound and the above Ti compound is calcined to form a first sintered body, and first raw material particles may be obtained by pulverizing the first sintered body. The first raw material particles may be prepared, for example, from a Ba compound, a Ti compound, a Bi compound and a Fe compound. A mixture of the Ba compound, the Ti compound, the Bi compound and the Fe compound is calcined to form a first sintered body, and the first raw material particles may be obtained by pulverizing the first sintered body. The ratio of the number of moles of Ba to the number of moles of Ti in the first raw material particles may be n:1 similarly to a case of $Ba_nTiO_3$ in the chemical formula 1. That is, the Ba compound and the Ti compound may be weighed respectively so that the ratio of the number of moles of Ba to the number of moles of Ti in the first raw material particles matches the composition of the perovskite-type oxide. The ratio of the number of moles of Bi to the number of moles of Fe in the first raw material particles may be m:1 similarly to $Bi_mFeO_3$ in the above chemical formula 1. That is, the Bi compound and the Fe compound may be weighed respectively so that the ratio of the number of moles of Bi to the number of moles of Fe in the first raw material particle matches the composition of the perovskite-type oxide. The first raw material particles may be a composite oxide including at least Ba and Ti (for example, $Ba_nTiO_3$). The first raw material particles may be a composite oxide including at least Ba, Ti, Bi and Fe. The first raw material particles may become the core 6 of the crystal particle 4 in the piezoelectric composition after sintering.

For example, the second raw material particles may be prepared from at least a Bi compound and a Fe compound. A mixture of the above Bi compound and the above Fe compound itself (a mixture of starting raw materials) may be used as the second raw material particles without calcination. The above mixture of a Bi compound and a Fe compound is calcined to form a second sintered body, and second raw material particles may be obtained by pulverizing the second sintered body. The second raw material particles may be prepared, for example, from a Ba compound, a Ti compound, a Bi compound and a Fe compound. The above mixture of a Ba compound, a Ti compound, a Bi compound and a Fe compound itself (a mixture of starting raw materials) may be used as the second raw material particles without calcination. The mixture of a Ba compound, a Ti compound, a Bi compound and a Fe compound is calcined to form a second sintered body, and second raw material particles may be obtained by pulverizing the second sintered body. The ratio of the number of moles of Bi to the number of moles of Fe in the second raw material particles may be m:1 similarly to $Bi_mFeO_3$ in the above chemical formula 1. That is, the Bi compound and the Fe compound may be weighed respectively so that the ratio of the number of moles of Bi to the number of moles of Fe in the second raw material particles matches the composition of the perovskite-type oxide. The ratio of the number of moles of Ba to the number of moles of Ti in the second raw material particles may be n:1 similarly to a case of $Ba_nTiO_3$ in the above chemical formula 1. That is, the Ba compound and the Ti compound may be weighed respectively so that the ratio of the number of moles of Ba to the number of moles of Ti in the second raw material particles matches the composition of the perovskite-type oxide. The second raw material particles may be a composite oxide including at least Bi and Fe (for example, $Bi_mFeO_3$). The second raw material particles may be a composite oxide including Ba, Ti, Bi, and Fe.

The ratio of the number of moles of Bi in the second raw material particles to the number of moles of Ba in the first raw material particles may be x:y similarly to cases of the above chemical formulae 1 and 2. The ratio of the number of moles of Fe in the second raw material particles to the number of moles of Ti in the first raw material particles may also be x:y similarly to cases of the above chemical formulae 1 and 2. When the content of Bi in all the first raw material particles is written as C1% by mass and the content of Bi in all the second raw material particles is written as C2% by mass, C1/C2 influences $C_{CORE}/C_{SHELL}$ in the piezoelectric composition. As the C1/C2 decreases, $C_{CORE}/C_{SHELL}$ also tends to decrease. Therefore, the $C_{CORE}/C_{SHELL}$ is controlled in the range of 0.10 to 0.95 by adjusting the C1/C2. The C1 and the C2 can be controlled respectively by adjusting the amounts of bismuth compounds at the time of weighing the respective starting raw materials of the first raw material particles and the second raw material particles.

For example, the first raw material particles may be prepared from at least a Fe compound and a Ti compound. In other words, the first raw material particles may include elements (Fe and Ti) occupying the B site of a perovskite structure (a crystal structure represented by formula $ABO_3$) of the crystal particles 4. A mixture of the above Fe compound and the above Ti compound is calcined to form a first sintered body, and first raw material particles may be obtained by pulverizing the first sintered body. The first raw material particles may be a composite oxide including at least Fe and Ti. Meanwhile, the second raw material particles may be prepared, for example, from at least a Bi compound and a Ba compound. In other words, the second raw material particles may include elements (Bi and Ba) occupying the A site of a perovskite structure (a crystal structure represented by a formula $ABO_3$) of the crystal particles 4. A mixture of the above Bi compound and the above Ba compound itself (a mixture of starting raw materials) may be used as the second raw material particles without calcination. A mixture of the above Bi compound and the above Ba compound is calcined to form a second sintered body, and second raw material particles may be obtained by pulverizing the second sintered body. The second raw material particles may be a composite oxide including at least Bi and Ba.

The average value of the primary particle sizes of the first raw material particles may be adjusted to a desired value by pulverizing the above first sintered body. The primary particle sizes of the first raw material particles influence the particle sizes of the crystal particles 4 comprised in the piezoelectric composition. Therefore, the average particle size of the crystal particles 4 comprised in the piezoelectric composition may be controlled by adjusting the average value of the primary particle sizes of the first raw material particles. The average value of the primary particle sizes of the second raw material particles may be adjusted to a desired value by pulverizing the above second sintered body. The average particle size of the crystal particles 4 comprised in the piezoelectric composition may be controlled by adjusting the average value of the primary particle sizes of the second raw material particles. The average particle size of the crystal particles 4 comprised in the piezoelectric composition may be controlled by adjusting the average values of the primary particle sizes of the first raw material particles and the second raw material particles. As the primary particle sizes of the first raw material particles become larger than the primary particle sizes of the second raw material particles, it becomes easy that the crystal particles 4, which have a core-shell structure, are formed.

The first raw material particles and the second raw material particles are mixed to prepare third raw material particles. As the ratio of the first raw material particles to all the third raw materials particles (for example, a mass ratio m1) becomes larger than the ratio of the second raw material particles to all the third material particles (for example, a mass ratio m2), the n/N tends to become small. That is, as m1/m2 becomes large, the number of the crystal particles 4 (particles having a core-shell structure) comprised in the piezoelectric composition tends to become small. Therefore, the n/N in the piezoelectric composition can be controlled in the range of 0.10 to 1.00 by adjusting the m1/m2. The n/N may be controlled in the range of 0.10 to 1.00 by the mixing ratio of the calcined particles having a core-shell structure (first raw material particles) to the raw material particles not having a core-shell structure (second raw material particles). The third raw materials particles may be adjusted by covering the surface of the first raw material particles with the second raw material particles. It is easy that the crystal particles 4, which have a core-shell structure, are formed by covering the surface of the first raw material particles with the second raw material particles.

A specific method for preparing the third raw particles may be, for example, as follows. First raw material particles and a solvent are mixed to prepare a first slurry. The first raw material particles in the first slurry may be pulverized by wet mixing the first slurry by using a ball mill or the like, and the average value of the primary particle sizes of the first raw material particles may be adjusted. Meanwhile, the second raw material particles and a solvent are mixed to prepare a second slurry. The second raw material particles in the second slurry may be pulverized by wet mixing the second slurry by using the ball mill or the like, and the average value of the primary particle sizes of the second raw material particles may be adjusted. The solvent to use for preparing each slurries may be, for example, water, an alcohol such as ethanol, or a mixture of water and ethanol.

The third slurry including the third raw material particles is prepared by mixing the first slurry and the second slurry by using the ball mill or the like. The third slurry is sprayed with a spray drier, and the dried third raw material particles are obtained. Then, the third raw material particles are calcined. The temperature of calcination may be 700 to 1050° C. The calcination may be around 1 to 3 hours. Calcination may be performed in the air atmosphere and may be performed in an oxidative atmosphere or pure oxygen. The wet pulverization of the third raw material particles is performed by using the ball mill or the like after the calcination. The pulverized third raw material particles are dried. A binder is added to the dried third raw material particles to obtain a formed body by press-forming the third raw material particles. The binder may be an organic binder such as polyvinyl alcohol or ethyl cellulose. A dispersing agent may be added to the binder. Then, a sintered body is formed by sintering the formed body. A debinding treatment (the decomposition of the binder by heating) of the formed body may be performed before the sintering of the formed body. The debinding treatment and the sintering of the formed body may be performed continuously, or may be performed separately.

The sintering temperature may be around 1050 to 1250° C. The sintering time may be around 1 to 8 hours. After the sintering of the formed body, the polarization process of the obtained sintered body is performed. The sintered body is cut into flakes and lap polishing is given to the surface of the sintered body before the polarization process. Cutting machines such as a cutter, a slicer or a dicing saw may be used for cutting the sintered body. After the lap polishing, temporary electrodes for the polarization process are formed both on a pair of the countering surfaces of the sintered body. An electrically conductive material constituting the temporary electrodes may be Cu, which can be removed easily by etching processing with a ferric chloride solution. A vacuum evaporation method or sputtering may be used for forming the temporary electrodes.

In the polarization process, a polarization electric field is applied between the pair of temporary electrodes sandwiching the sintered body. The temperature of the sintered body subjected to a polarization process may be 150 to 300° C. The time to apply a polarization electric field may be 1 to 30 minutes. The polarization electric field may be 0.9 or more times as strong as the coercive electric field of the sintered body.

The temporary electrodes are removed from the sintered body by etching processing or the like after the polarization process. The sintered body is processed into a desired shape to form a piezoelectric body 2. A pair of electrodes 5a and 5b are formed on the surfaces of the piezoelectric body 2, and the piezoelectric body 2 is sandwiched between the electrodes 5a and 5b. The electrodes 5a and 5b can be formed by a vacuum evaporation method, sputtering or a plating method. A piezoelectric device 10 is completed through the above steps.

The uses of the piezoelectric device 10 comprising the piezoelectric composition according to this embodiment are varied. The piezoelectric device 10 may be applied, for example, to an oscillator, a resonator, an actuator, a motor or a sensor. The specific use of the piezoelectric device may be, for example, a SAW filter, a BAW filter, a piezoelectric microphone, a head assembly, a hard disk drive and a printer head, an ink jet printer device, an ultrasonic washing machine, an ultrasonic motor, an atomizer oscillator, a fish finder, a shocking sensor, an ultrasonic diagnostic device, a waste toner sensor, a gyro sensor, a buzzer, a transformer or a lighter.

Preferable embodiments of the present invention are described above, but the present invention is not necessarily limited to the embodiments mentioned above.

For example, the piezoelectric body 2 may be a thin film including the piezoelectric composition according to the present invention. The piezoelectric composition according to the present invention may be a powder.

EXAMPLES

The present invention will be described in detail by using Examples and Comparative Example hereinafter. However, the present invention is not limited to the following Examples at all.

Example 1

[Production of Sintered Body]

$BaCO_3$ powder, $TiO_2$ powder, $Bi_2O_3$ powder and $Fe_2O_3$ powder were weighed, respectively, so that the number of moles of Ba, the number of moles of Ti, the number of moles of Bi and the number of moles of Fe became equal. That is, $BaCO_3$ and $TiO_2$ were weighed, respectively, so that the ratio of the number of moles of Ba to the number of moles of Ti satisfies the composition ($BaTiO_3$) forming a perovskite-type crystal structure. $Bi_2O_3$ and $Fe_2O_3$ were weighed, respectively, so that the ratio of the number of moles of Bi to the number of moles of Fe satisfies the composition ($BaFeO_3$) forming a perovskite-type crystal structure. Then, slurry was prepared by mixing $BaCO_3$, $TiO_2$, $Bi_2O_3$, $Fe_2O_3$ and pure water by the ball mill for 16 hours. The molar ratio of Ba, Ti, Bi and Fe included in the slurry, was also 1:1:1:1. A mixed powder of $BaCO_3$, $TiO_2$, $Bi_2O_3$ and $Fe_2O_3$ was obtained by heating the slurry at 120° C. and drying the slurry. This mixed powder was calcined at 600 to 850° C. for 2 hours to obtain a calcined powder (a first raw material particle). First slurry was obtained by mixing the first raw material particles and pure water by the ball mill for 16 hours and pulverizing the first raw material particles.

As the second raw material particles, a mixture of the powder of $BaCO_3$, the powder of $TiO_2$, the powder of $Bi_2O_3$ and the powder of $Fe_2O_3$ was prepared. The powder of $BaCO_3$ and the powder of $TiO_2$ were weighed, respectively, so that the number of moles of Ba becomes equal to the number of moles of Ti. That is, $BaCO_3$ and $TiO_2$ were weighed, respectively, so that the ratio of the number of moles of Ba to the number of moles of Ti satisfies the composition ($BaTiO_3$) forming a perovskite-type crystal structure. A powder of $Bi_2O_3$ and a powder of $Fe_2O_3$ were weighed, respectively, so that the number of moles of Bi and the number of moles of Fe become equal. That is, $Bi_2O_3$ and $Fe_2O_3$ were weighed, respectively, so that the ratio of the number of moles of Bi to the number of moles of Fe satisfies the composition ($BiFeO_3$) forming a perovskite-type crystal structure. The mass of Bi included in all the second raw material particles was adjusted to a value larger than the mass of Bi included in all the first raw material particles. Then, second slurry including the second raw material particles was prepared by mixing the second raw material particles and pure water by the ball mill for 16 hours. The mass of Bi included in all the second slurry was larger than the mass of Bi included in all the first slurry.

Third slurry was prepared by mixing the first slurry and the second slurry by using the ball mill. Third raw material particles composed of the first raw material particles and the second raw material particles covering the first raw material particles were obtained by spraying the third slurry with a spray drier. Then, the third raw material particles were calcined at 700° C. for 2 hours. The calcination of the third raw material particles was performed in the air atmosphere. After the calcination, the wet pulverization of the third raw material particles was performed by using the ball mill. After the wet pulverization, the third raw material particles were dried and mixed with a binder. A formed body was formed from the mixture of the third raw material particles and the binder. The formed body was sintered at 1000° C. The sintering of the formed body was performed in the air atmosphere. The sintering time of the formed body was 4 hours. A sintered body composed of a piezoelectric composition in Example 1 was obtained through the above steps.

For the following analysis, a sintered body of Comparative Example 1 was obtained in the same method described above except that the second slurry and the third slurry were not prepared and the first slurry was used instead of the third slurry.

[Analysis of Sintered Body (Piezoelectric Composition)]

Figure 4:
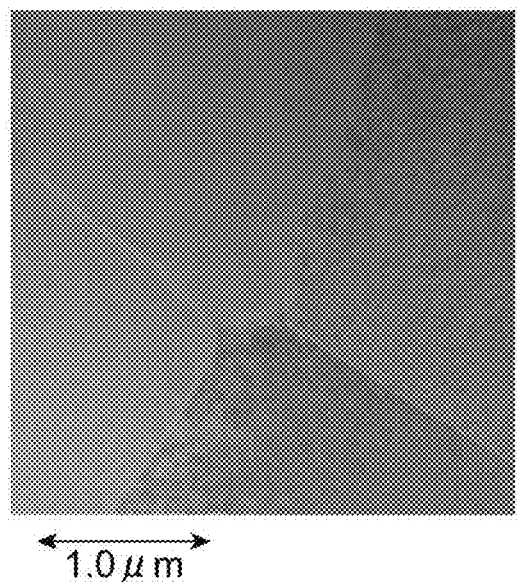
FIG. 4 is a photograph of a portion of the section of a piezoelectric composition (sintered body) of Comparative Example 1.

To analyze the section of the sintered body of Comparative Example 1, the section of the sintered body of Comparative Example 1 was irradiated with a gallium ion beam, and a flaky sample of Comparative Example 1 was produced. The photograph of the section of the sample of Comparative Example 1 was taken by a STEM. A JEM-2100F manufactured by JEOL Ltd. was used as a STEM. The section of the sintered body of Comparative Example 1 is illustrated in FIG. 4. As illustrated in FIG. 4, in the section of the sintered body of Comparative Example 1, crystal particles having a core-shell structure were not found.

Figure 5A:
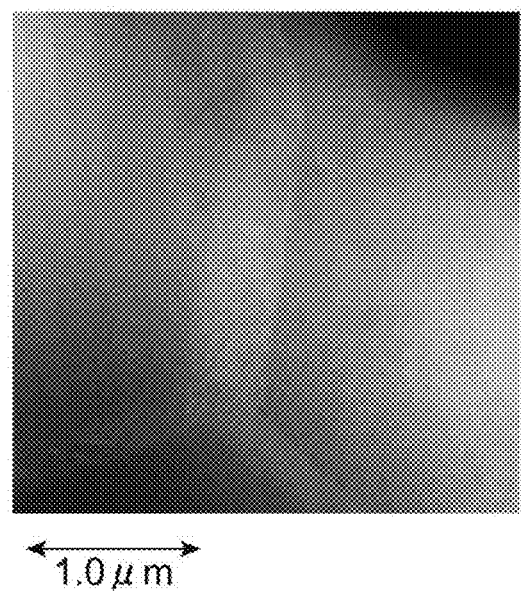
FIG. 5A is a photograph of a portion of the section of a piezoelectric composition (sintered body) in Example 1.
Figure 5B:
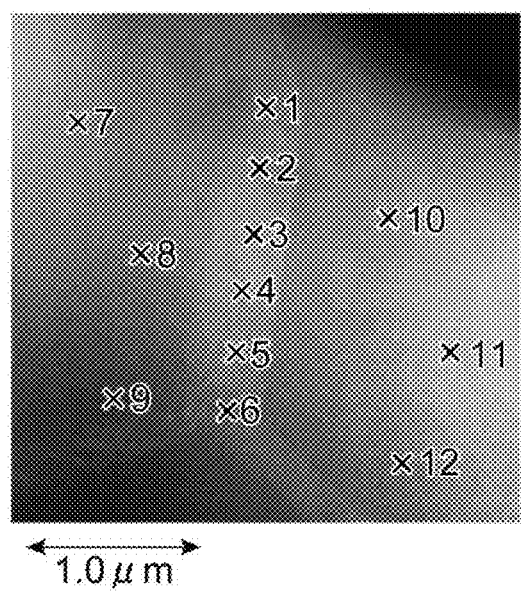
FIG. 5B illustrates points at which the composition was analyzed in the section of the piezoelectric composition (sintered body) illustrated in FIG. 5A.

In the same method as the case of Comparative Example 1, the sample (flaky sintered body) of Example 1 was produced. The photograph of the section of the sintered body of Example 1 was taken by the STEM. The sections of the sintered body of Example 1 is illustrated in FIG. 5A and FIG. 5B. The section illustrated in FIG. 5B is the same as the section illustrated in FIG. 5A. The compositions of a plurality of measured points 1 to 12 illustrated in FIG. 5B (respective points to which X marks are appended) were analyzed by an STEM-EDS. As results of the analysis based on the STEM and an EDS, it was confirmed that the sintered body of Example 1 is a composite oxide including bismuth, iron, barium and titanium. It was confirmed that a plurality of crystal particles in the section of the sintered body of Example 1 are also the above composite oxide. It has also been confirmed that the plurality of crystal particles in the section of the sintered body of Example 1 are composed of a core and a shell covering the core and the contents of Bi in the cores are lower than the contents of Bi in the shells. Measured points 1 to 6 illustrated in FIG. 5B belong to the shell of either of two crystal particles, and are located near a grain boundary between the two crystal particles (near the interface between two shells). Measured points 7, 8 and 9 illustrated in FIG. 5B belong to the core of crystal particles. Meanwhile, measured points 10 to 12 illustrated in FIG. 5B belong to the core of the other crystal particles. The contents of elements at the respective measured points 1 to 6 belonging to shells are illustrated in Table 1 below. The average values of the contents of elements at the respective measured points 1 to 6 are illustrated in Table 1 below. The contents of elements at the respective measured points 7 to 12 belonging to the cores are illustrated in the following Table 2. The average values of the contents of elements at the respective measured points 7 to 12 are illustrated in the following Table 2. The unit of the contents of the elements illustrated in Tables 1 and 2 below is % by mass. As illustrated in Tables 1 and 2 below, the contents of Bi in the cores of the crystal particles were lower than the contents of Bi in the shells of the crystal particles. Crystal particles composed of a core and a shell covering the core will be described as "core-shell particles" hereinafter.

TABLE 1

| | Contents (% by mass) of Elements in Shells | | | |
|---|---|---|---|---|
| Measured point | Ti | Fe | Ba | Bi |
| 1 | 5.32 | 23.14 | 5.01 | 33.42 |
| 2 | 5.02 | 23.88 | 6.07 | 34.21 |
| 3 | 5.46 | 24 | 5.16 | 33.45 |
| 4 | 4.46 | 23.96 | 6.59 | 33.83 |
| 5 | 4.1 | 23.18 | 5.86 | 34.01 |
| 6 | 4.81 | 24.24 | 5.65 | 33.6 |
| Average | 4.9 | 23.7 | 5.7 | 33.8 |

TABLE 2

| | Contents (% by mass) of Elements in Cores | | | |
|---|---|---|---|---|
| Measured point | Ti | Fe | Ba | Bi |
| 7 | 6.33 | 20.47 | 6.74 | 30.35 |
| 8 | 5.08 | 20.71 | 7.96 | 30.13 |
| 9 | 7.21 | 20.52 | 7.77 | 29.61 |
| 10 | 6.96 | 21.22 | 6.76 | 30.39 |
| 11 | 6.31 | 21.42 | 7.06 | 30.06 |
| 12 | 5.09 | 20.41 | 7.25 | 29.78 |
| Average | 6.2 | 20.8 | 7.3 | 30.1 |

The section of the sintered body of Example 1 was observed by the STEM, and 100 core-shell particles existing in the section of the sintered body were selected at random. The core-shell particles were analyzed respectively by the STEM-EDS, and the contents of Bi at five or more measured points belonging to the cores of the respective core-shell particles were measured. The average value of the contents of Bi at all the measured points belonging to the cores of all the core-shell particles ($C_{CORE}$% by mass) was calculated. The contents of Bi in five or more measured points belonging to the shells of the respective core-shell particles were measured. The average value of the contents of Bi in all the measured points belonging to the shells of all the core-shell particles ($C_{SHELL}$% by mass) was calculated. It was confirmed that the $C_{CORE}$ is lower than the $C_{SHELL}$ in Example 1.

Twelve points belonging to the section of the sintered body of Example 1 were analyzed by the STEM and the STEM-EDS. The number of all the particles existing in each visual field was counted, and the total value N of the number of all the particles existing in all the visual field was calculated. "All the particles" include core-shell particles, and also include crystal particles not having a core-shell structure. The number of core-shell particles existing in each visual field was counted, and the total value n of the number of core-shell particles existing in all the visual field was calculated. The size of visual fields of analyzed points was 5 μm×5 μm. The n/N in Example 1 was calculated from the n and the N. The n/N in Example 1 was a value illustrated in Table 3 below.

[Measurement of Piezoelectric Constant $d_{33}$]

The piezoelectric constant $d_{33}$ (unit: pC/N) of the sintered body (piezoelectric composition) of Example 1 was measured by using a $d_{33}$ meter. The $d_{33}$ meter is a device for measuring $d_{33}$s by the Berlincourt method based on JIS (Japanese Industrial Standards) R 1696. In the Berlincourt method, the $d_{33}$ is measured by utilizing a piezoelectric positive effect at the time when vibration is given to a piezoelectric composition. Therefore, in the Berlincourt method, there is no influence of electrostriction differently from a measuring method in which a piezoelectric reverse effect at the time when an electric field is applied to a piezoelectric composition is utilized, and the original $d_{33}$ of a piezoelectric composition is obtained. The $d_{33}$ in Example 1 was a value illustrated in Table 3 below. It is preferable that $d_{33}$ is 200 pC/N or more.

Examples 2 to 9, Comparative Example 1

When the mass of the second raw material particles included in the second slurry was expressed as M2 and the mass of the first raw material particles included in the first slurry was expressed as M1, in Example 2, the M1/M2 was adjusted to a value smaller than that of the case of Example 1. A sintered body (piezoelectric composition) of Example 2 was produced by the same method as in Example 1 except for the value of the M1/M2.

In Example 3, the M1/M2 was adjusted to a value smaller than that of the case of Example 2. A sintered body (piezoelectric composition) of Example 3 was produced by the same method as in Example 1 except for the value of the M1/M2.

In Example 4, the M1/M2 was adjusted to a value smaller than that of the case of Example 3. A sintered body (piezoelectric composition) of Example 4 was produced by the same method as in Example 1 except for the value of the M1/M2.

In Example 5, the M1/M2 was adjusted to a value smaller than that of the case of Example 4. A sintered body (piezoelectric composition) of Example 5 was produced by the same method as in Example 1 except for the value of the M1/M2.

In Example 6, the M1/M2 was adjusted to a value smaller than that of the case of Example 5. A sintered body (piezoelectric composition) of Example 6 was produced by the same method as in Example 1 except for the value of the M1/M2.

In Example 7, the M1/M2 was adjusted to a value smaller than that of the case of Example 6. A sintered body (piezoelectric composition) of Example 7 was produced by the same method as in Example 1 except for the value of the M1/M2.

In Example 8, the M1/M2 was adjusted to a value smaller than that of the case of Example 7. A sintered body (piezoelectric composition) of Example 8 was produced by the same method as in Example 1 except for the value of the M1/M2.

In Example 9, the M1/M2 was adjusted to a value smaller than that of the case of Example 8. A sintered body (piezoelectric composition) of Example 9 was produced by the same method as in Example 1 except for the value of the M1/M2.

As above-mentioned, in Comparative Example 1, the second slurry and the third slurry were not prepared, and the first slurry was used instead of the third slurry. A sintered body (piezoelectric composition) of Comparative Example 1 was produced by the same method as in Example 1 except for this matter.

The sintered bodies of Examples 2 to 9 and Comparative Example 1 were analyzed, respectively, by the same method as in Example 1. It was confirmed that all of the sintered bodies of Examples 2 to 9 are composite oxides including bismuth, iron, barium and titanium similarly to Example 1. It was confirmed that all of the sintered bodies of Examples 2 to 9 comprise a plurality of core-shell particles similarly to Example 1. It was confirmed that $C_{CORE}$s are lower than $C_{SHELL}$s in all of Examples 2 to 9. Meanwhile, the existence of core-shell particles could not be confirmed in the section of the sintered body of Comparative Example 1. The respective n/Ns in Examples 2 to 9 and Comparative Example 1 were values illustrated in Table 3 below.

The $d_{33}$s of the respective sintered bodies of Examples 2 to 9 and Comparative Example 1 were measured by the same method as in Example 1. The $d_{33}$s of the respective sintered bodies of Examples 2 to 9 and Comparative Example 1 were values illustrated in Table 3 below. As illustrated in Table 3 below, all of the $d_{33}$s of the respective sintered bodies of Examples 1 to 9 were 200 pC/N or more. Meanwhile, the $d_{33}$ of the sintered body of Comparative Example 1 was less than 200 pC/N.

Examples 10 to 19, Comparative Example 2

In Example 10, C1/C2 was adjusted to a value larger than that of the case of Example 3. C1 is the content (unit: mass %) of Bi in all the first raw material particles. C2 is the content (unit: mass %) of Bi in all the second raw material particles. A sintered body (piezoelectric composition) of Example 10 was produced by the same method as Example 3 except for this matter. All M1/M2s in Examples 10 to 19 were the same as that of the case of Example 3.

In Example 11, C1/C2 was adjusted to a value smaller than that of the case of Example 10. A sintered body (piezoelectric composition) of Example 11 was produced by the same method as Example 3 except for this matter.

In Example 12, C1/C2 was adjusted to a value smaller than that of the case of Example 11. A sintered body (piezoelectric composition) of Example 12 was produced by the same method as Example 3 except for this matter.

In Example 13, C1/C2 was adjusted to a value smaller than that of the case of Example 12. A sintered body (piezoelectric composition) of Example 13 was produced by the same method as Example 3 except for this matter.

In Example 14, C1/C2 was adjusted to a value smaller than that of the case of Example 13. A sintered body (piezoelectric composition) and a piezoelectric device of Example 14 was produced by the same method as Example 3 except for this matter.

In Example 15, C1/C2 was adjusted to a value smaller than that of the case of Example 14. A sintered body (piezoelectric composition) of Example 15 was produced by the same method as Example 3 except for this matter.

In Example 16, C1/C2 was adjusted to a value smaller than that of the case of Example 15. A sintered body (piezoelectric composition) of Example 16 was produced by the same method as Example 3 except for this matter.

In Example 17, C1/C2 was adjusted to a value smaller than that of the case of Example 16. A sintered body (piezoelectric composition) of Example 17 was produced by the same method as Example 3 except for this matter.

In Example 18, C1/C2 was adjusted to a value smaller than that of the case of Example 17. A sintered body (piezoelectric composition) of Example 18 was produced by the same method as Example 3 except for this matter.

In Example 19, C1/C2 was adjusted to a value smaller than that of the case of Example 18. A sintered body (piezoelectric composition) of Example 19 was produced by the same method as Example 3 except for this matter.

In Comparative Example 2, C1/C2 were adjusted to 1.0. That is, in the case of Comparative Example 2, the content of Bi in the first slurry was equal to the content of Bi in the second slurry. A sintered body (piezoelectric composition) of Comparative Example 2 was produced by the same method as Example 3 except for this matter.

The respective sintered bodies of Examples 10 to 19 and Comparative Example 2 were analyzed by the same method as in Example 1. It was confirmed that all of the sintered bodies of Examples 10 to 19 are composite oxides including bismuth, iron, barium and titanium similarly to Example 1. It was confirmed that all of the sintered bodies of Examples 10 to 19 comprise a plurality of core-shell particles similarly to Example 1. Meanwhile, the existence of core-shell particles could not be confirmed in the section of the sintered body of Comparative Example 2. The respective n/Ns in Examples 10 to 19 and Comparative Example 2 were values illustrated in Table 4 below. The respective $C_{CORE}$s and $C_{SHELL}$s in Examples 10 to 19 and Comparative Example 2 were calculated by the same method as in Example 1. Additionally, $C_{CORE}/C_{SHELL}$s were calculated from the $C_{CORE}$s and the $C_{SHELL}$s in Examples 10 to 19 and Comparative Example 2, respectively. The respective $C_{CORE}/C_{SHELL}$s in Examples 10 to 19 and Comparative Example 2 were values illustrated in Table 4 below. It was confirmed that $C_{CORE}$s are lower than $C_{SHELL}$s in all of Examples 10 to 19. The value (1.00) of $C_{CORE}/C_{SHELL}$ in Comparative Example 2 described in Table 4 below does not mean that the sintered body of Comparative Example 2 comprises core-shell particles. The value (1.00) of the $C_{CORE}/C_{SHELL}$ in Comparative Example 2 means that Bi is dispersed nearly homogeneously all over the crystal particles comprised in the sintered body and there is no difference between the contents of Bi inside the crystal particles and near the grain boundaries.

The $d_{33}$s of the respective sintered body of Examples 10 to 19 and Comparative Example 2 were measured by the same method as in Example 1. The $d_{33}$s of the respective sintered bodies of Examples 10 to 19 and Comparative Example 2 were values illustrated in Table 4 below. As illustrated in Table 4 below, all the $d_{33}$s of the respective sintered bodies of Examples 10 to 19 were 200 pC/N or more. Meanwhile, the $d_{33}$ of the sintered body of Comparative Example 2 was less than 200 pC/N.

TABLE 3

|  | n/N | $d_{33}$ [pC/N] |
|---|---|---|
| Example 1 | 0.10 | 223 |
| Example 2 | 0.20 | 234 |
| Example 3 | 0.30 | 238 |
| Example 4 | 0.40 | 240 |
| Example 5 | 0.50 | 240 |
| Example 6 | 0.60 | 241 |
| Example 7 | 0.70 | 249 |
| Example 8 | 0.80 | 250 |
| Example 9 | 0.90 | 251 |
| Comparative Example 1 | 0.00 | 102 |

TABLE 4

|  | n/N | $C_{CORE}/C_{SHELL}$ | $d_{33}$ [pC/N] |
|---|---|---|---|
| Example 10 | 0.30 | 0.95 | 218 |
| Example 11 | 0.30 | 0.90 | 243 |
| Example 12 | 0.30 | 0.80 | 248 |
| Example 13 | 0.30 | 0.70 | 250 |
| Example 14 | 0.30 | 0.60 | 258 |
| Example 15 | 0.30 | 0.50 | 251 |
| Example 16 | 0.30 | 0.40 | 248 |
| Example 17 | 0.30 | 0.30 | 247 |
| Example 18 | 0.30 | 0.20 | 245 |
| Example 19 | 0.30 | 0.10 | 239 |
| Comparative Example 2 | 0.00 | 1.00 | 68 |

INDUSTRIAL APPLICABILITY

According to the present invention, a piezoelectric composition where the $d_{33}$ is high, and a piezoelectric device comprising the piezoelectric composition are provided.

REFERENCE SIGNS LIST

2: piezoelectricity body (piezoelectric composition); 2cs: section of piezoelectric body (piezoelectric composition); 4: crystal particle; 6: core; 8: shell; 5a, 5b: electrode; 10: piezoelectric device; 18: grain boundary

What is claimed is:

1. A piezoelectric composition comprising a plurality of crystal particles, wherein
    the piezoelectric composition includes bismuth, iron, barium, titanium, and oxygen;
    the crystal particle includes a core and a shell covering the core;
    an average value of contents of bismuth in the cores is expressed as $C_{CORE}$ % by mass,
    an average value of contents of bismuth in the shells is expressed as $C_{SHELL}$ % by mass, and
    the $C_{CORE}$ is lower than the $C_{SHELL}$; and
    a number of all particles comprised in the piezoelectric composition is expressed as N,
    a number of the crystal particles including the core and the shell is expressed as n, and
    n/N is 0.10 to 1.00.

2. The piezoelectric composition according to claim 1, wherein
    the $C_{CORE}/C_{SHELL}$ is 0.10 to 0.95.

3. The piezoelectric composition according to claim 1, wherein
the piezoelectric composition is a sintered body.
4. A piezoelectric device comprising the piezoelectric composition according to claim 1.
5. The piezoelectric device according to claim 4, wherein a piezoelectric constant $d_{33}$ of the piezoelectric composition to which an electric field of 0.1 to 2.0 kV/mm is applied is 200 pC/N or more.

* * * * *